US012772894B2

(12) United States Patent
Sun et al.

(10) Patent No.: US 12,772,894 B2
(45) Date of Patent: Oct. 20, 2026

(54) SENSING CHIP PACKAGING STRUCTURE AND METHOD

(71) Applicants: NATIONAL CENTER FOR ADVANCED PACKAGING CO., LTD, Jiangsu (CN); SHANGHAI XIANFANG SEMICONDUCTOR CO., LTD, Shanghai (CN)

(72) Inventors: Peng Sun, Jiangsu (CN); Liqiang Cao, Jiangsu (CN); Yulong Ren, Jiangsu (CN)

(73) Assignees: NATIONAL CENTER FOR ADVANCED PACKAGING CO., LTD, Jiangsu (CN); SHANGHAI XIANFANG SEMICONDUCTOR CO., LTD, Shanghai (CN)

( * ) Notice: Subject to any disclaimer, the term of this patent is extended or adjusted under 35 U.S.C. 154(b) by 428 days.

(21) Appl. No.: 18/285,653

(22) PCT Filed: May 26, 2022

(86) PCT No.: PCT/CN2022/095175
§ 371 (c)(1),
(2) Date: Oct. 5, 2023

(87) PCT Pub. No.: WO2023/273718
PCT Pub. Date: Jan. 5, 2023

(65) Prior Publication Data
US 2024/0186200 A1 Jun. 6, 2024

(30) Foreign Application Priority Data
Jun. 29, 2021 (CN) ......................... 202110730617.9

(51) Int. Cl.
*H10W 74/10* (2026.01)
*H10W 20/20* (2026.01)
(Continued)

(52) U.S. Cl.
CPC .......... *H10W 74/117* (2026.01); *H10W 20/20* (2026.01); *H10W 70/698* (2026.01);
(Continued)

(58) Field of Classification Search
CPC ... H01L 23/481; H01L 23/147; H01L 23/565; H01L 24/072; H01L 2224/6325; H01L 2924/181; H10L 23/3128
(Continued)

(56) References Cited

U.S. PATENT DOCUMENTS

2010/0164082 A1 7/2010 Fujisawa
2015/0115437 A1* 4/2015 Cai ....................... H01L 23/147
257/737

FOREIGN PATENT DOCUMENTS

CN 101804959 A * 8/2010 ............. H01L 24/97
CN 105679685 6/2016
(Continued)

OTHER PUBLICATIONS

"International Search Report (Form PCT/ISA/210) of PCT/CN2022/095175", mailed on Jul. 22, 2022, with English translation thereof, pp. 1-5.

*Primary Examiner* — Phuc T Dang
(74) *Attorney, Agent, or Firm* — JCIPRNET

(57) ABSTRACT

The present invention relates to the field of chip packaging technology, and proposes a package structure and method of sensing chip. The package structure comprising: a substrate; a silicon interposer; and a plurality of chips, the plurality of chips comprising sensing chips as well as non-sensing chips, wherein the non-sensing chips are molded with molding compound and the sensing chips are exposed. By arranging a protective cover above the sensing chip before the front side of the chip is molded, and grinding off the top of the protective cover after molding, the present invention can
(Continued)

well solve the problem that the sensing signal of the sensing chip cannot penetrate the molding compound in the prior art, and can be effectively used for the packaging of the sensing chip.

6 Claims, 3 Drawing Sheets

(51) Int. Cl.
*H10W 70/698* (2026.01)
*H10W 74/01* (2026.01)
*H10W 90/00* (2026.01)
*H10W 74/00* (2026.01)

(52) U.S. Cl.
CPC ......... *H10W 74/016* (2026.01); *H10W 90/00* (2026.01); *H10W 74/00* (2026.01); *H10W 90/724* (2026.01)

(58) Field of Classification Search
USPC .......................................................... 257/678
See application file for complete search history.

(56) References Cited

FOREIGN PATENT DOCUMENTS

| | | |
|---|---|---|
| CN | 110676240 | 1/2020 |
| CN | 111383927 | 7/2020 |
| CN | 212967700 | 4/2021 |
| CN | 113451236 | 9/2021 |

* cited by examiner

SENSING CHIP PACKAGING STRUCTURE AND METHOD

CROSS-REFERENCE TO RELATED APPLICATION

This application is a 371 of international application of PCT application serial no. PCT/CN2022/095175, filed on May 26, 2022, which claims the priority benefit of China application no. 202110730617.9, filed on Jun. 29, 2021. The entirety of each of the above mentioned patent applications is hereby incorporated by reference herein and made a part of this specification.

TECHNICAL FIELD

The present invention generally relates to the field of chip packaging technology. Specifically, the present invention relates to a package structure and method of sensing chip.

BACKGROUND

CoWoS (Chip on Wafer on Substrate) is a commonly used 2.5D packaging method in multi-chip integrated system package, and products that utilize this packaging method include NVIDIA's Tesla V100 and AMD's Radeon VII. However, the use of CoWoS package will cover the surface of the chip with molding compound, and usually the sensing signals collected by sensing chips, such as MEMS (Micro-Electro-Mechanical System) chips, optical sensor chips, pressure sensor chips, etc., cannot penetrate the molding compound, and therefore it is not suitable for the package of sensing chips.

SUMMARY

Aiming at the problem that the 2.5D packaging method commonly used in the prior art is not suitable for sensing chip package, the present invention proposes a package structure of sensing chip, comprising:

- a substrate, on which a silicon interposer is arranged;
- a silicon interposer, on which a plurality of chips are arranged; and
- a plurality of chips, comprising sensing chips as well as non-sensing chips, wherein the non-sensing chips are molded with molding compound and the sensing chips are exposed.

In one embodiment of the present invention, it is specified that, characterized in that:

- the silicon interposer is internally provided with a plurality of through-silicon-vias, the through-silicon-vias connect the upper surface to the lower surface of the silicon interposer.

In one embodiment of the present invention, it is specified that,

- the upper parts of the plurality of through-silicon-vias are connected to the plurality of chips; and
- the lower parts of the plurality of through-silicon-vias are provided with bumps, the plurality of through-silicon-vias are connected with the substrate through the bumps.

In one embodiment of the present invention, it is specified that, the sensing chips comprise micro-electro-mechanical system chips, optical sensor chips, pressure sensor chips.

The present invention also proposes a method for forming the package structure of sensing chip, characterized in that, comprising the following steps:

- forming a plurality of through-silicon-vias inside of the silicon interposer;
- processing the upper surface of the silicon interposer;
- arranging a plurality of chips on the upper surface of the silicon interposer, wherein the plurality of chips are connected with upper parts of the plurality of the through-silicon-vias;
- arranging a protective cover above the sensing chip;
- molding the upper surface of the silicon interposer with molding compound;
- thinning the lower part of the silicon interposer to expose the lower parts of the plurality of the through-silicon-vias at the lower surface of the silicon interposer, and forming bumps at the lower parts of the plurality of the through-silicon-vias;
- thinning the molding compound and grinding off the top of the protective cover above the sensing chips to expose the sensing chips; and
- cutting the silicon interposer and mounting the modules with multiple chips arranged on the silicon interposer on the substrate.

In one embodiment of the present invention, it is specified that, forming the plurality of through-silicon-vias inside of the silicon interposer comprises the following steps:

- cleaning the silicon interposer;
- coating photoresist on the silicon interposer, and exposing and developing the photoresist;
- etching the silicon interposer to form a plurality of through-silicon-via structures;
- depositing a dielectric insulating layer on sidewalls of the plurality of through-silicon-via structures;
- depositing a metal seed layer on sidewalls of the plurality of through-silicon-via structures, and
- filling metal in the plurality of through-silicon-via structures through electroplating.

In one embodiment of the present invention, it is specified that, processing the upper surface of the silicon interposer comprises the following steps:

- performing chemical mechanical planarization grind on the upper surface of the silicon interposer;
- forming a metal interconnection structure on the upper surface of the silicon interposer; and
- forming under-bump metallization structures or micro-bump structures on the upper surface of the silicon interposer.

In one embodiment of the present invention, it is specified that: the protective cover comprises a plastic protective cover or a metal protective cover; the dimensions of the protective cover are compatible with the dimensions of the sensing chip, including 10×10 mm-35×35 mm.

In one embodiment of the present invention, it is specified that, thinning a lower part of the silicon interposer to expose lower parts of the plurality of the through-silicon-vias at the lower surface of the silicon interposer, and forming bumps at the lower parts of the plurality of the through-silicon-vias comprises the following steps:

- thinning the lower part of the silicon interposer to a distance of 10-30 um from the bottom of the through-silicon-vias through the thinning grinding wheel of the wafer thinning equipment;
- etching the lower part of the silicon interposer 5 using fluorine-containing gases until the lower parts of the plurality of through-silicon holes are entirely exposed to form a thinned surface;
- depositing a silicon oxide layer on the thinned surface by a CVD process;

thinning the silicon oxide layer by a CMP process and exposing the filling metal of the plurality of through-silicon-vias; and forming a UBM structure at the position where the filling metal is exposed, and forming bumps at the UBM structure.

In one embodiment of the present invention, it is specified that, thinning the molding compound by the thinning grinding wheel of the wafer thinning equipment;

when using a plastic protective cover, thinning the molding compound and the top of the protective cover by a first thinning grinding wheel until the sensing chip is exposed; and when using a metal protective cover, thinning the molding compound by the first thinning grinding wheel until it touches the metal protective cover, and replacing with a second thinning grinding wheel to thin the molding compound and the top of the protective cover until the sensing chip is exposed.

The present invention at least has the following beneficial effect: by arranging a protective cover above the sensing chip before the front side of the chip is molded, and grinding off the top of the protective cover after molding, the problem that the sensing signal of the sensing chip cannot penetrate the molding compound in the prior art can be well solved, and can be effectively used for the package of the sensing chip.

BRIEF DESCRIPTION OF THE DRAWINGS

To further explain the above and other advantages and features of various embodiments of the present invention, more specific description of various embodiments of the present invention will be provided with reference to the accompanying drawings. It can be understood that these accompanying drawings depict only typical embodiments of the present invention, and therefore will not be considered as limiting their scope. In the accompanying drawings, identical or corresponding parts will be indicated by the same or similar reference numerals for the sake of clarity.

DETAILED DESCRIPTION

It should be noted that various components in the accompanying drawings may be exaggerated for the purpose of illustrative illustration and are not necessarily in the correct scale. In the accompanying drawings, components that are identical or functionally identical are provided with the same accompanying drawing reference signs.

In the present invention, unless otherwise specified, the words “arranged on”, “arranged above” and “arranged over” do not exclude the existence of intermediates between the two. In addition, “arranged on or above” only indicates the relative positional relationship between the two components, but under certain circumstances, such as when the product direction is reversed, it can be converted to “arranged under or below”, and vice versa.

In the present invention, the embodiments are merely intended to illustrate the scheme of the present invention and should not be construed as limiting.

In the present invention, the quantifiers “a” and “one” do not exclude scenarios with multiple elements, unless otherwise specified.

It should also be noted herein that in embodiments of the present invention, only a portion of the components or assemblies may be shown for the sake of clarity and simplicity, but those ordinary skilled in the art will be able to understand that the required components or assemblies may be added as needed according to specific scenarios in light of the teachings of the present invention. In addition, features in different embodiments of the present invention may be combined with each other unless otherwise indicated. For example, a feature in the second embodiment may be substituted for a corresponding or functionally identical or similar feature in the first embodiment, and the resulting embodiment likewise falls within the scope of the disclosure or the scope of the record of the present application.

It should also be noted that, within the scope of the present invention, the terms “the same”, “equal”, “equal to”, etc. do not mean that the two numerical values are absolutely equal, but rather allow for a certain reasonable error, that is to say, the terms also cover “substantially the same”, “substantially equal” and “substantially equal to”. By analogy, in the present invention, the terms “perpendicular to”, “parallel to”, etc., which indicate direction, also cover the meaning of “substantially perpendicular to”, “substantially parallel to”.

In addition, the numbering of the steps of various methods of the present invention does not limit the order in which the steps of the method are performed. Unless otherwise indicated, the steps of various methods may be performed in a different order.

The present invention will be further described below with reference to the accompanying drawings in conjunction with specific embodiments.

Figure 7:
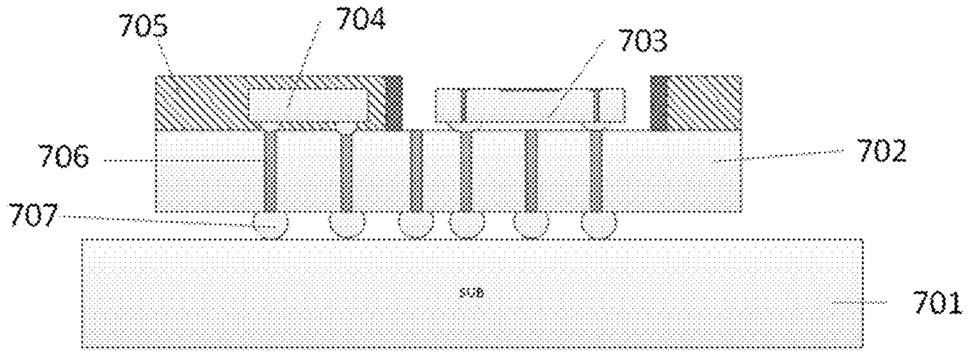
FIG. 7 illustrates a structural schematic diagram of a package structure of sensing chip according to an embodiment of the present invention.

As shown in FIG. 7, a package structure of sensing chip is proposed, comprising a substrate 701, a silicon interposer 702, and a plurality of chips. Wherein the silicon interposer 702 is arranged on the substrate 701, and the plurality of chips are arranged on the silicon interposer 702. The plurality of chips comprise sensing chips 703 as well as non-sensing chips 704, wherein the non-sensing chips 704 are molded with molding compound 705 and the sensing chips 703 are exposed. The silicon interposer 702 is internally provided with a plurality of through-silicon-vias 706, which connect the upper surface to the lower surface of the silicon interposer 702. The upper parts of the plurality of through-silicon-vias 706 are connected to the plurality of chips; and the lower parts of the plurality of through-silicon-vias 706 are provided with bumps 707, the plurality of through-silicon-vias 706 are connected with the substrate 701 through the bumps 707.

In one embodiment of the present invention, a method for forming the package structure of sensing chip is also proposed, comprising the following steps.

Figure 1:
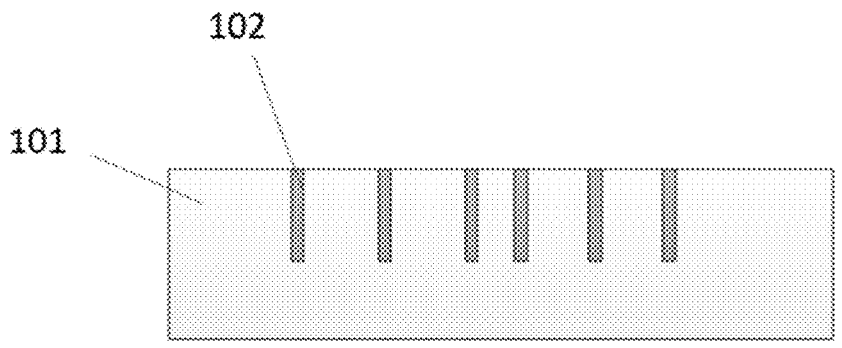
FIGS. 1-6 illustrate structural schematic diagrams of a process for forming a package structure of sensing chip according to an embodiment of the present invention.

As shown in FIG. 1, first a plurality of through-silicon-vias 102 are internally formed inside of the silicon interposer 101, and the upper surface of the silicon interposer 101 is processed.

Forming the plurality of through-silicon-vias 102 may comprise the following steps.

Clean the silicon interposer 101.

Coat photoresist on the silicon interposer 101, and expose and develop the photoresist.

Perform dry etching on the silicon adapter plate 101 through plasma to form a plurality of through-silicon-via structures.

Form a dielectric insulating layer on the sidewall of the through-silicon-via structure by a CVD (chemical vapor deposition) process or an ALD (atomic layer deposition) process. The material of dielectric insulating layer may be, for example, silicon oxide, silicon nitride, silicon oxynitride, etc.

Deposit a metal seed layer on the sidewall of the through-silicon-via structure by a PVD (Physical vapor deposition) process or an ALD process. The material of the metal seed layer may include, for example, Ti, Ta, and Cu. In addition, a metal diffusion barrier layer is formed by using titanium nitride TiN, tantalum nitride TaN, to prevent the diffusion of electroplating metal to surrounding materials during the subsequent electroplating process.

And perform metal filling of the through-silicon-via structure through electroplating to complete the construction of the plurality of through-silicon-vias 102. A common filling metal may be Cu, for example.

Processing the upper surface of the silicon interposer 101 may comprise the following steps.

Perform CMP (Chemical Mechanical Planarization) grinding on the upper surface of the silicon interposer 101 on which the through-silicon-vias electroplating is completed, so that only the metal in the through-silicon-via structure remains in the silicon interposer 101.

Form a metal interconnection structure on the upper surface of the silicon interposer 101. If the line width and line spacing dimensions of the metal interconnection structure are in the micrometer range, e.g., L/S=2/2 um, the metal interconnection structure is typically constructed using an organic insulation layer and copper RDL (ReDistribution Layer) process. If the line width and line spacing dimensions are in the sub-micron range, e.g., L/S=0.5/0.5 um, the metal interconnection structure is typically constructed using the Damascus copper process.

And after completing the construction of the metal interconnection structure, a UBM (under-bump metallization) structure or micro-bump structure may be formed at the position where the chip needs to be mounted. The material of the UBM structure may include, for example, Ti/Cu, Ti/Cu/Ni/Cu, Ti/Cu/Ni/Au, etc.; the material of the micro-bump structure may include, for example, Cu/SnAg, Cu/Ni/SnAg, Cu/Ni/Cu/SnAg, etc.

Figure 2:
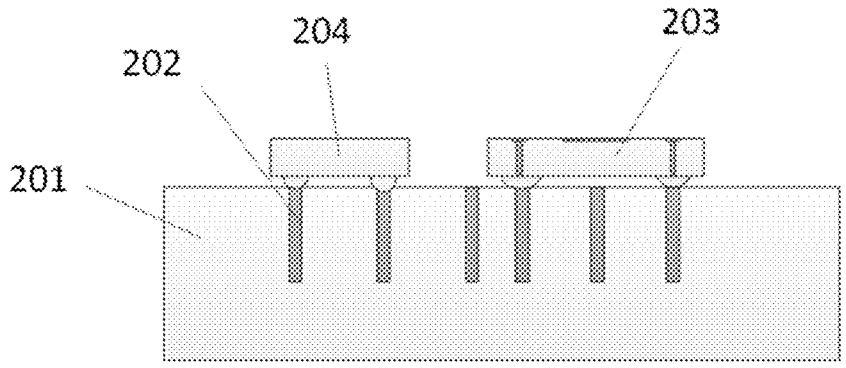

As shown in FIG. 2, a plurality of chips are arranged on the upper surface of the silicon interposer 201, wherein the plurality of chips are connected to the upper parts of the plurality of through-silicon-vias 202. The plurality of chips include sensing chip 203 and non-sensing chip 204.

Figure 3:
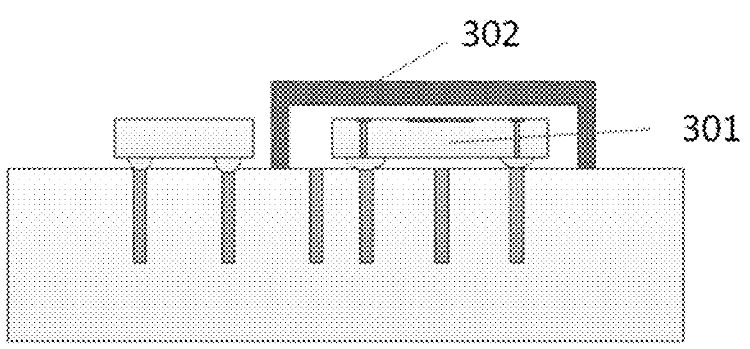

As shown in FIG. 3, a protective cover 302 is arranged above the sensing chip 301. For example, first, glue is applied on the protective cover mounting position around the sensing chip 301, and then the protective cover 302 is inverted above the sensing chip, and the glue may be cured at high temperature through an oxygen-free oven, so as to ensure that there is sufficient bonding strength between the protective cover 301 and the silicon interposer. The material of the protective cover may be, for example, a plastic type, a metal type, and the metal protective cover may be, for example, a nickel-plated copper protective cover or a stainless steel protective cover. The size of the protective cover is matched with the size of the sensing chip, for example, 10×10 mm-35×35 mm.

Figure 4:
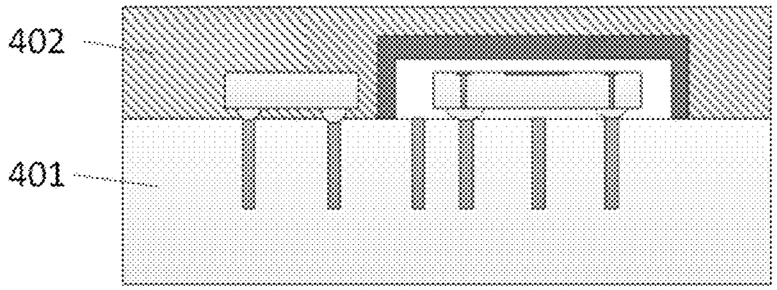

As shown in FIG. 4, the upper surface of the silicon interposer 401 is molded with molding compound 402.

Figure 5:
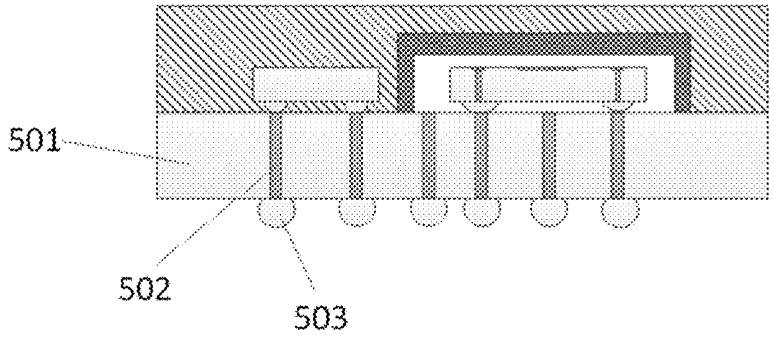

As shown in FIG. 5, the lower part of the silicon interposer 501 is thinned to expose the lower parts of the plurality of the through-silicon-vias 502 at the lower surface of the silicon interposer, and bumps 503 are formed at the lower parts of the plurality of the through-silicon-vias 502, which may comprise the following steps.

The lower part of the silicon interposer 501 may be thinned by the thinning grinding wheel of the wafer thinning equipment which is stopped at a distance of 10-30 um from the bottom of the through-silicon-vias.

The lower part of the silicon interposer 501 continues to be etched using a fluorine-containing gas which is stopped after the through-silicon-via structure is entirely exposed to form a thinned surface.

A silicon oxide layer is deposited on the thinned surface by a CVD process.

The silicon oxide layer is thinned by a CMP process and the filling metal of the plurality of through-silicon-vias 502 is exposed.

And UBM structures are formed at the position where the filling metal is exposed, and bumps 503 are formed at the UBM structures by repeating yellow light, sputtering, electroplating, and stripping processes.

Figure 6:
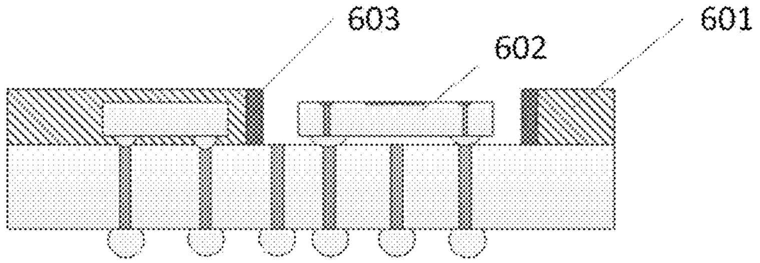

As shown in FIG. 6, the molding compound 601 is thinned and the top of the protective cover 603 above the sensing chip 602 is ground off to expose the sensing chip 602. Wherein, the molding compound 601 may be entirely thinned through a thinning grinding wheel of the wafer thinning equipment. If a plastic protective cover is used, the thinning grinding wheel may not be replaced during the thinning process until the sensing chip is exposed, and the molding compound debris scattered on the sensing chip is cleaned by a wet process. If a metal protective cover is used, after the molding compound is thinned to touch the metal protective cover, the thinning grinding wheel needs to be replaced to accommodate the metal hardness and the metal extension phenomenon that occurs during the grinding process.

And as shown in FIG. 7, the silicon interposer is cut and the modules with multiple chips arranged on the silicon interposer 702 are mounted on the substrate 701 to complete the construction of the sensing chip packaging structure.

Figure 8:
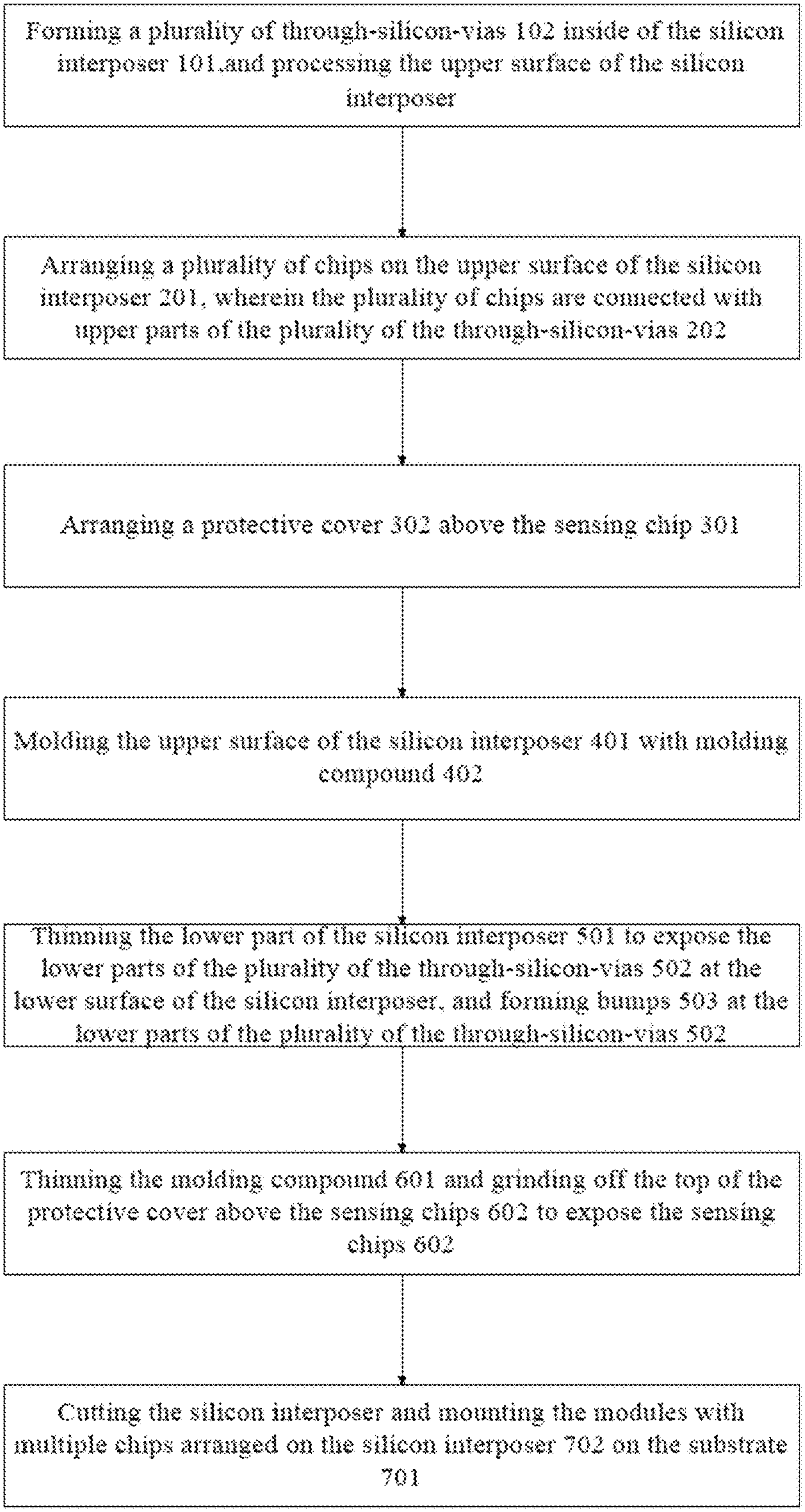
FIG. 8 illustrates a schematic flow diagram for forming a package structure of sensing chip according to an embodiment of the present invention.

The overall flowchart of the method for forming the package structure of sensing chip is shown in FIG. 8.

Although the various embodiments of the present invention have been described above, however, it should be understood that they are presented only as examples and not as limitations. It will be apparent to those skilled in the relevant art that various combinations, variations and changes can be made thereto without departing from the spirit and scope of the present invention. Therefore, the width and scope of the present invention disclosed herein should not be limited by the exemplary embodiments disclosed above, but should only be defined based on the accompanying claims and their equivalents.

What is claimed is:

1. A method for forming a package structure of sensing chip comprising a substrate, a silicon interposer arranged on the substrate, and a plurality of chips arranged on the silicon interposer and comprising sensing chips and non-sensing chips, wherein the non-sensing chips are molded with a molding compound, the sensing chips are exposed, and the method comprises the following steps:

forming a plurality of through-silicon-vias inside the silicon interposer;

processing an upper surface of the silicon interposer;

arranging the plurality of chips on the upper surface of the silicon interposer, wherein the plurality of chips are connected with upper parts of the plurality of through-silicon-vias;

arranging a protective cover above the sensing chips;

molding the upper surface of the silicon interposer with the molding compound;

thinning a lower part of the silicon interposer to expose lower parts of the plurality of through-silicon-vias at a lower surface of the silicon interposer, and forming bumps at the lower parts of the plurality of through-silicon-vias;

thinning the molding compound and grinding off a top of the protective cover above the sensing chips to expose the sensing chips; and cutting the silicon interposer and mounting modules with the plurality of chips arranged on the silicon interposer on the substrate.

2. The method for forming the package structure of sensing chip according to claim 1, wherein forming the plurality of through-silicon-vias inside the silicon interposer comprises the following steps:

cleaning the silicon interposer;

coating a photoresist on the silicon interposer, and exposing and developing the photoresist;

etching the silicon interposer to form a plurality of through-silicon-via structures;

depositing a dielectric insulating layer on sidewalls of the plurality of through-silicon-via structures;

depositing a metal seed layer on the sidewalls of the plurality of through-silicon-via structures, and filling metals in the plurality of through-silicon-via structures through electroplating.

3. The method for forming the package structure of sensing chip according to claim 1, wherein processing the upper surface of the silicon interposer comprises the following steps:

performing a chemical mechanical planarization grinding on the upper surface of the silicon interposer;

forming a metal interconnection structure on the upper surface of the silicon interposer; and forming an under-bump metallization structure or a micro-bump structure on the upper surface of the silicon interposer.

4. The method for forming the package structure of sensing chip according to claim 1, wherein: the protective cover comprises a plastic protective cover or a metal protective cover; the dimensions of the protective cover are compatible with the dimensions of the sensing chip, including 10×10 mm-35×35 mm.

5. The method for forming the package structure of sensing chip according to claim 2, wherein thinning the lower part of the silicon interposer to expose the lower parts of the plurality of through-silicon-vias at the lower surface of the silicon interposer, and forming the bumps at the lower parts of the plurality of through-silicon-vias comprises the following steps:

thinning the lower part of the silicon interposer to a distance of 10 μm to 30 μm from the bottom of the through-silicon-vias through a thinning grinding wheel of a wafer thinning equipment;

etching the lower part of the silicon interposer by using a fluorine-containing gas until the lower parts of the plurality of through-silicon vias are entirely exposed to form a thinned surface;

depositing a silicon oxide layer on the thinned surface by a CVD process;

thinning the silicon oxide layer by a CMP process and exposing the filling metals of the plurality of through-silicon-vias; and forming UBM structures at positions where the filling metals are exposed, and forming bumps at the UBM structures.

6. The method for forming the package structure of sensing chip according to claim 4, wherein:

thinning the molding compound by a thinning grinding wheel of a wafer thinning equipment;

when using the plastic protective cover, thinning the molding compound and the top of the protective cover by a first thinning grinding wheel until the sensing chip is exposed; and when using the metal protective cover, thinning the molding compound by the first thinning grinding wheel until it touches the metal protective cover, and replacing with a second thinning grinding wheel to thin the molding compound and the top of the protective cover until the sensing chip is exposed.

* * * * *